(12) United States Patent
Train et al.

(10) Patent No.: US 6,177,803 B1
(45) Date of Patent: Jan. 23, 2001

(54) MONITORING ELEMENTS IN A MULTI-PHASE ALTERNATING CURRENT NETWORK

(75) Inventors: David Train, Framingham; Philip A. von Guggenberg, Cambridge; George A. Cavigelli, Lexington, all of MA (US)

(73) Assignee: Doble Engineering Company, Watertown, MA (US)

( * ) Notice: Under 35 U.S.C. 154(b), the term of this patent shall be extended for 0 days.

(21) Appl. No.: 08/475,407

(22) Filed: Jun. 7, 1995

(51) Int. Cl.$^7$ .................................................. G01R 31/42
(52) U.S. Cl. .......................................... 324/552; 324/551
(58) Field of Search .................................... 324/551, 552, 324/557, 622, 541, 691

(56) References Cited

U.S. PATENT DOCUMENTS

| | | | |
|---|---|---|---|
| 1,945,263 | * | 1/1934 | Doble .................................... 324/551 |
| 2,146,069 | * | 2/1939 | Higgins ................................. 324/552 |
| 3,710,242 | * | 1/1973 | Povey ..................................... 324/54 |
| 4,757,263 | * | 7/1988 | Cummings et al. .................. 324/552 |

OTHER PUBLICATIONS

Meyer et al., "On–Line Monitoring of Insulation Systems: Theory, Design and Field Data".
Square D Company, "InsAlert Insulation Current Monitor", Clearwater, FL, 1995.
Vujovic et al., "Development of an On–Line Continuous Tan(σ) Monitoring System", 1994 IEEE International Symposium on Electrical Insulation, Pittsburgh, PA, Jun. 5–8, 1994.
Sokolov "On–Line Monitoring System Bushing Condition Evaluation", Part 1, 1995.
Sokolov et al. "On–Line Monitoring System Bushing Condition Evaluation", Part 2, 1995.
Letter from Victor Sokolov to Jerry Jodice who received it May 5, 1995.
Information on KIV application. Is valid from Jan. 8, 1983 to Jan. 8, 1988.
Sokolov et al. "On–Line Monitoring of High Voltage Bushings", 1995.
Allan et al. "A Continuous Insulation Monitor for High Voltage Transformer Bushings", 7th International Symposium on High Voltage Engineering, Dresden, Aug. 26–30, 1991.
Allan, Blundell, Boyd and Hinde, New Techniques for Monitoring the Insulation Quality of In–SErvice HV Apparatus, IEEE Transactions on Electrical insulation, V. 27, No. 3, Jun., 1992.*
Boylestad, Introductory Circuit Analysis, 5th edition, Merrill Publishing, Columbus, OH 43216, pp. 463–477 (No month), 1987.*

* cited by examiner

*Primary Examiner*—Glenn W. Brown
(74) *Attorney, Agent, or Firm*—Fish & Richardson P.C.

(57) ABSTRACT

A group of bushings receives voltage in parallel to produce a current output from each bushing. Cumulatively combining the current outputs from the bushings vectorially furnishes a vector sum bushing current. Reference voltage devices also produce reference current outputs. Cumulatively combining the reference current outputs vectorially provides a vector sum reference current, and differentially vectorially combining the vector sum reference current with the vector sum bushing current delayed by 90° provides a difference signal representative of a bushing condition. As an alternative to the reference voltage devices, a second group of bushings may be used. In this case, a delay of 90° is not required. The invention may also be used to monitor the condition of other capacitive devices, for example, high voltage current transformers.

46 Claims, 12 Drawing Sheets

MONITORING ELEMENTS IN A MULTI-PHASE ALTERNATING CURRENT NETWORK

The present invention relates to a multi-phase measuring system to be used for the determination of certain electrical characteristics of electrical power apparatus. As a particular embodiment of the technique, the present description pertains to a method for the evaluation of the quality of high voltage insulation systems. The procedure covers an application for the measurement of changes in capacitance and/or power factor of either transformer bushings or other electrical apparatus in which the line-to-ground insulation may be considered to be part of a capacitance system. The measurements are made while the apparatus is energized during normal service operation.

For background, reference is made to V. Sokolov, On-Line Monitoring System Bushing Condition Evaluation, Part 1: Summary of Bushing Monitoring Experience in the Former USSR, Minutes of the Sixty-Second Annual International Conference of Doble Clients (1995); V. Sokolov & B. Vanin, On-Line Monitoring System Bushing Condition Evaluation, Part 2: Comparison of Power Factor Measurement with Leakage Current Imbalance Measurement, Minutes of the Sixty-Second Annual International Conference of Doble Clients (1995), P. Vujovic and R. K. Fricker, Development of an On-Line Continuous Tan (δ) Monitoring System, Conference Record of the 1994 IEEE International Symposium on Electrical Insulation (1994); and D. M. Allan, K. J. Boyd and D. D. Hinde, A Continuous Insulation Monitor for High Voltage Transformer Bushings, 7th International Symposium on High Voltage Engineering, Technische Universitat Dresden (1991).

According to the invention, a method of monitoring a group of three elements, such as bushings in a three-phase alternating current network connected in parallel to a three-phase voltage supply includes producing a current output from a tap of each bushing and adding the current outputs from the bushing taps vectorially to obtain a vector sum bushing current. Apparatus according to the invention includes three reference devices connected in parallel to the three-phase voltage supply to produce a current output from each reference device, and a vector adder that vectorially adds the current outputs from the reference devices to obtain a vector sum reference current. Differentially combining the vector sum reference current with the vector sum bushing current provides a difference current representative of a bushing condition. The reference devices may be other groups of bushings, or potential transformers, or coupling capacitor voltage transformers (CCVTs), or bushing potential devices, or high voltage current transformers, or optical voltage transducers. If potential transformers or other voltage devices are used as references, they may be loaded with resistors so that the currents through the resistors are substantially equal to the currents derived from the taps of the bushings. Further, the vector sum bushing current may be delayed by ninety degrees before differentially combining the vector sum potential transformer current to correct for a phase difference between the two vector sum currents.

Additionally, successive vector difference currents may be differentially combined to provide a sequence of incremental vector difference currents. That is to say, the group of bushings and reference devices may be periodically scanned. The vector sum bushing currents may be converted into a signal suitable for transmission for remote monitoring. The current outputs of each bushing may be scaled, by electronic gain or through taps in the primary windings of a current transformer. The current outputs from the bushings and the reference devices may, if necessary, be corrected for temperature effects.

Apparatus may include a detector for obtaining the bushing current outputs and a means for combining the bushing current outputs into a vector sum bushing current (resultant) and comparing the vector sum bushing current with a vector sum reference current. The detector may be a portable device. For a plurality of groups of bushings on different voltage buses, a multiplexer may be used to simultaneously scan pairs of bushing groups and reference voltage devices connected in parallel on the same bus. The multiplexer and detector may be located at a remote station. The current outputs and the reference current may be transmitted to the remote station in digital form.

A method of diagnosing the conditions of a group of bushings on a multi-phase alternating current network may include calculating a differential value indicative of a change of capacitance and/or power factor of the bushings, and providing a message to the user if the differential value exceeds a threshold value. The difference between the differential value and the threshold may be determined to be large or small, which may be indicated in the message to the user. The threshold value may be determined from prior stored measurements taken from the bushings. The initial values of the capacitance and power factor of the bushings may be stored. The approximate values of the capacitance and power factors of the bushings may be estimated based on detected changes and the stored initial values of the capacitance and power factor.

An advantage of the present invention is to permit monitoring of bushings in which the capacitance and/or power factor of the bushings change.

Another advantage is to provide an economical monitoring system since only one signal from each group of bushings is monitored and analyzed.

The method and apparatus of the invention may be used to monitor the degradation of high voltage bushing insulation systems during normal operation. The bushings of high voltage power transformers account for a high percentage of transformer problems. When a transformer bushing fails, it may result in the destruction of the entire transformer and other damage. The invention may also be used to monitor the degradation of high voltage current transformer insulation systems. Such transformers are frequently provided with taps in the high voltage insulation structure and, on three-phase networks, the current transformers can be monitored by comparing a set of three transformers against another reference set on the same parallel voltage bus. Alternatively, the first set of current transformers may be compared against a set of transformer bushings or against a set of reference voltage devices.

Periodic diagnostic measurements made on transformer bushings provide evidence of a trend in the measured quantities which would be indicative of deteriorating insulation. The apparatus and method of the present invention allows for on-line monitoring of transformer bushings.

Numerous other features, objects and advantages of the invention will become apparent from the following detailed description when read in connection with the accompanying drawings in which.

With reference now to the drawings, the equivalent circuits of three bushings 10, 11 and 12 are connected to a 3-phase voltage supply 8 with lines A, B and C. Typical quantities measured during diagnostic tests of bushings are the values of capacitance and power factor relating to the capacitances $C_1$ between the high voltage source 8 and the potential taps 20, 21 and 22 and the tap capacitances $C_2$ between the potential taps 20, 21 and 22 and the bushing mounting flanges connected to ground. An increase or decrease in capacitance and/or power factor between diagnostic measurements is considered to be due to insulation deterioration.

The bushing monitoring system is especially advantageous for monitoring apparatus installed in 3-phase alternating current networks. The present invention utilizes the property that even though all three bushings on a given 3-phase transformer will age at the same rate initially, as the insulation degradation progresses, one bushing will eventually begin to deteriorate at a faster rate than the other two. Bushing capacitance and power factor values increase with age, and the invention detects when either of these quantities has increased on any bushing by a predetermined amount above the corresponding values of the other two bushings in a 3-phase group.

Figure 1:
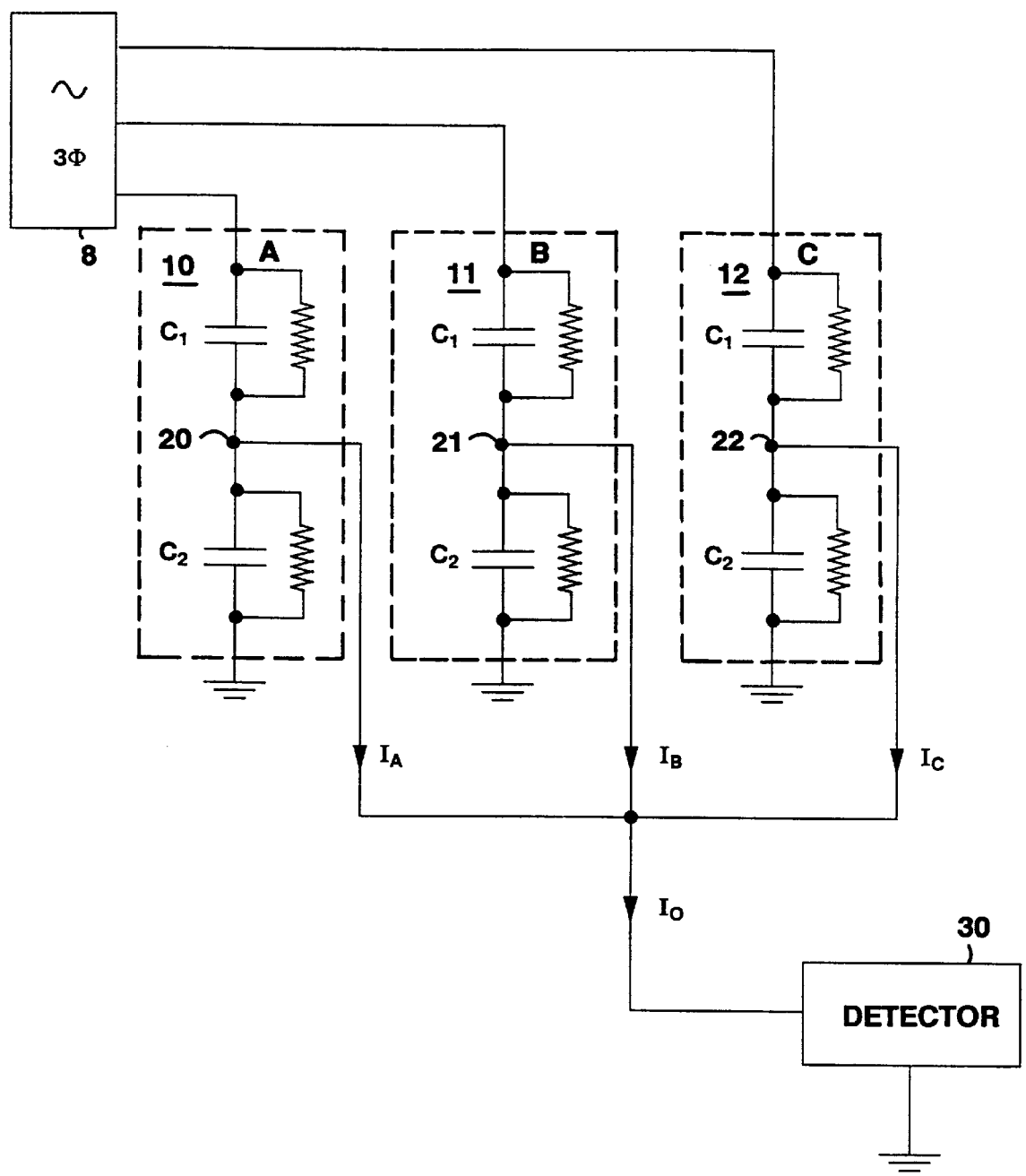
FIG. 1 is a schematic diagram of a circuit involving three bushings connected in parallel to a three-phase voltage supply.

In FIG. 1, the bushing taps 20, 21, and 22, which are normally connected to ground to short-circuit the $C_2$ capacitances, are instead connected together. It is assumed that the three bushings 10, 11 and 12 are identical and that the 3-phase voltage supply is perfectly balanced. Under such circumstances, the vector sum bushing current $I_o$ of the three currents $I_A$, $I_B$ and $I_C$ derived from the bushing taps 20, 21 and 22 will be zero. If capacitance and power factor values of the three bushings increase at the same rate due to aging, the vector sum bushing current $I_o$ will remain at zero. However, when the characteristics of any one bushing begin to change at a faster rate than the other two bushings, the vector sum bushing current $I_o$ will no longer be zero. A detector 30 furnishes an alarm signal when the vector sum bushing current $I_o$ exceeds a predetermined threshold level.

The three bushings may not be identical with respect to capacitance and power factor, even if they are made by the same manufacturer and are of the same type. Minor variations in capacitance and power factor are normal and will cause a resultant vector sum bushing current $I_o$ to flow into the detector 30. In addition, due to normal variations in load, the system voltage may not always be perfectly balanced. Variations in line-to-ground voltages may occur and cause corresponding variations in the bushing currents $I_A$, $I_B$ and $I_C$. Such variations may produce detectable variations in the vector sum bushing current $I_o$. Thus, the change in the vector sum bushing current $I_o$ may be greater than the maximum acceptable levels caused by changes in bushing characteristics due to aging. Variations in system balance are compensated for to avoid false determinations of deterioration.

The compensation procedure involves subtracting from the vector sum of the bushing currents $I_A$, $I_B$ and $I_C$ the vector sum of a reference group of currents derived from the same voltage bus. The procedure utilizes signals proportional to the line-to-ground voltage of the transmission system. In one embodiment, the signals are derived from high voltage potential transformers which are installed in the same substation as the power transformer and which are electrically in parallel with the bushings to be monitored. In another embodiment, the reference currents are derived from another group of three bushings all on the same parallel voltage bus. The number of bushings to be monitored may be any multiple of three, provided each of these bushings is on the same parallel voltage bus. The reference currents may also be obtained from coupling capacitor voltage transformers, bushing potential devices or optical voltage transducers. The system may also be used for circuit breaker bushings and high voltage current transformers.

Figure 2:
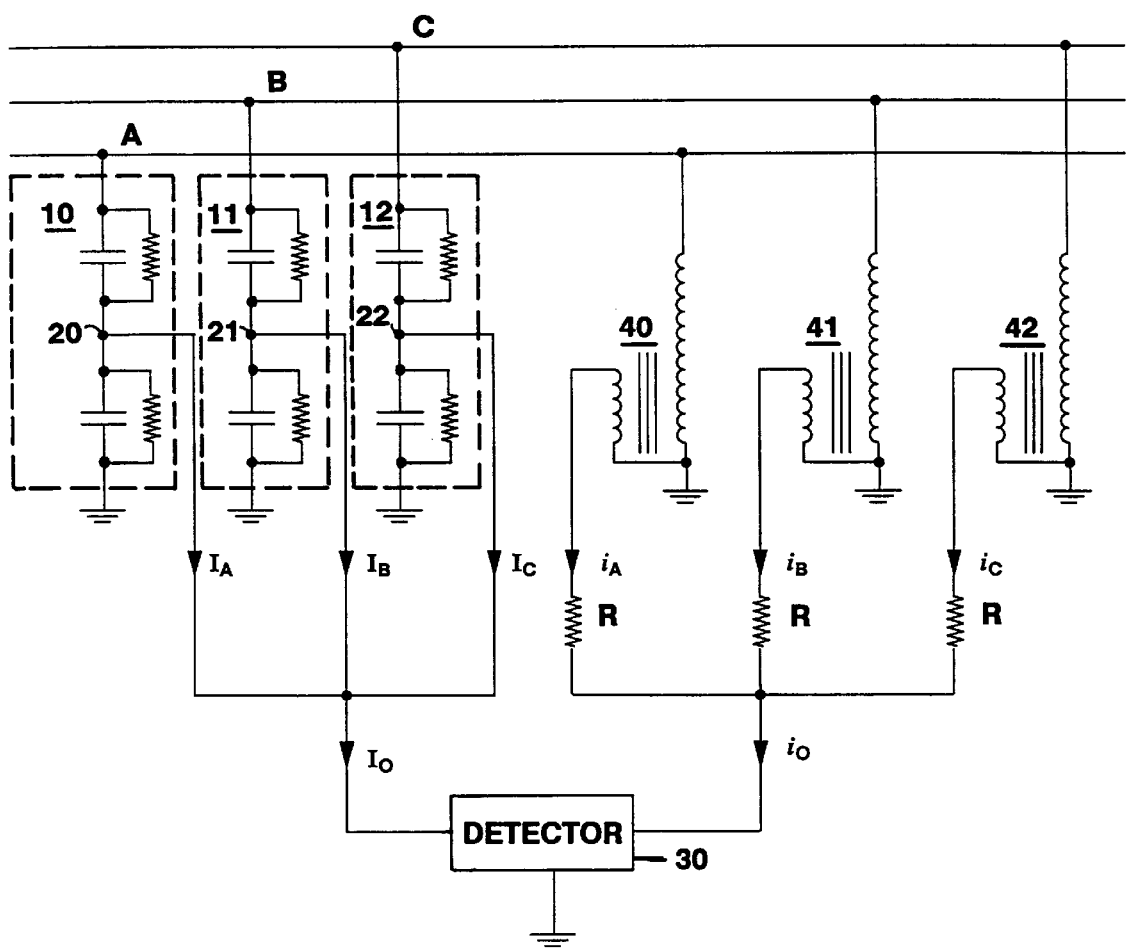
FIG. 2 is a schematic diagram of a three-bushing circuit, including the addition of currents from three potential transformers connected in parallel to the three-phase voltage supply.

FIG. 2 illustrates the compensation procedure. Three identical potential transformers 40, 41 and 42 are electrically in parallel with the bushings 10, 11 and 12 to be monitored. The secondary windings of potential transformers 40, 41 and 42 are loaded with identical resistors R, the values of which are selected so that the current outputs $i_A$, $i_B$ and $i_C$ are approximately equal to the bushing currents $I_A$ $I_B$ and $I_C$. The ratios of the potential transformer currents to the bushing currents are approximately unity, and the vector sum potential transformer current $i_o$ is proportional to the degree of unbalance of the system voltages. The vector sum bushing current $I_o$ also reflects changes in system imbalance. Therefore, differentially combining the vector sum transformer current $i_o$ with the vector sum bushing current $I_o$ furnishes a difference current $i_D$ representing only those differences caused by changes in capacitance and/or power factor of one of the bushings.

FIG. 3 pertains to a comparison between the resultant current from a bushing set and a resultant reference current derived from a set of potential transformers. In this case the residual vector current from the bushing set must be delayed by 90° before being differentially combined with the residual reference current. This also applies if the residual reference current is derived from some other set of voltage devices such as coupling capacitor voltage transformers (CCVTs), bushing potential devices, and optical voltage transducers. However, if the residual reference current is derived from another set of bushings or a set of high voltage current transformers, for example, the 90° delay in the residual vector current from the bushing set being monitored is not required.

Figure 3A:
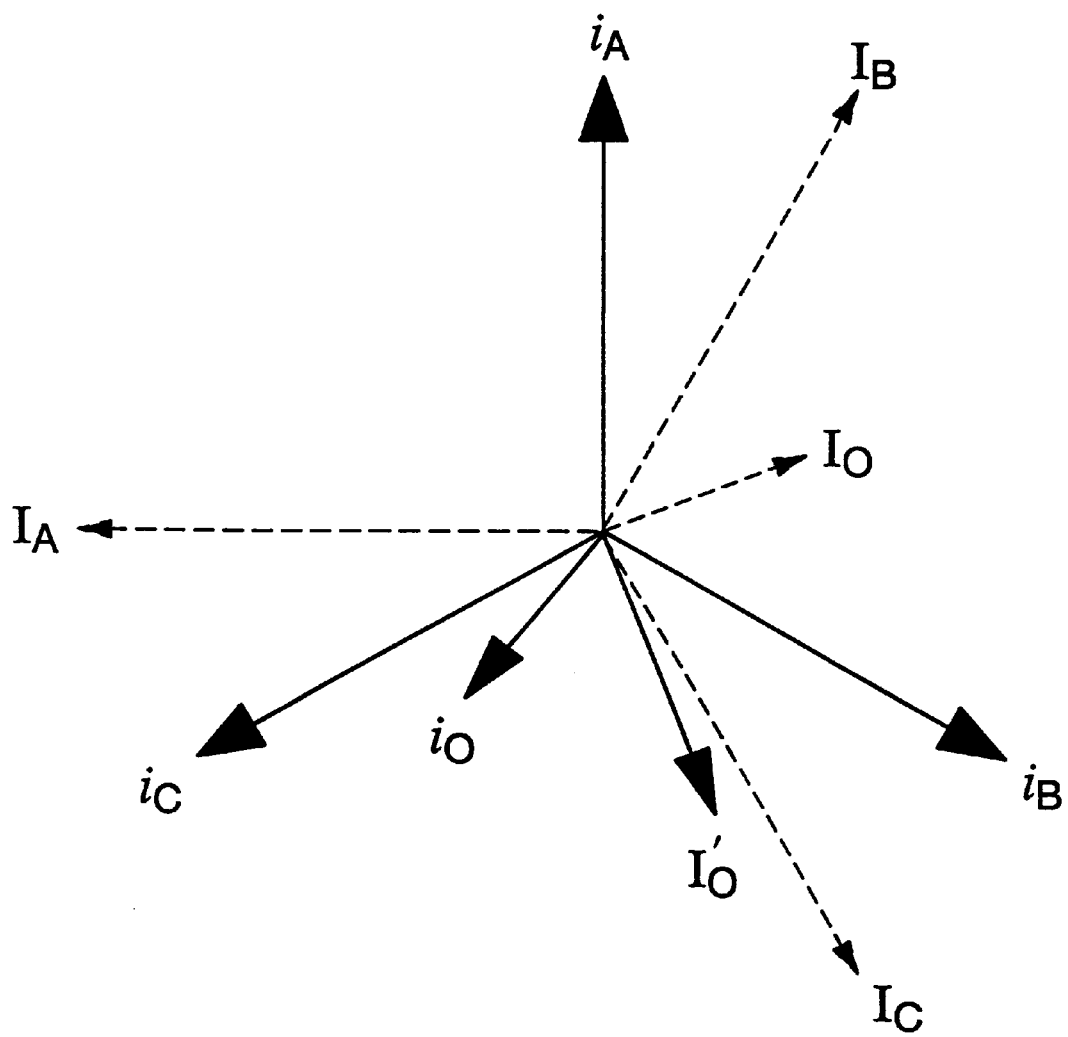
FIGS. 3a and 3b are vector diagrams of the vector sum of the currents derived from the bushings, the vector sum of the currents derived from potential transformers, and the difference between these vector sum currents.

As shown in FIG. 3a, the bushing currents $I_A$, $I_B$ and $I_C$ together with their residual vector sum bushing current $I_o$ are shown by the dashed lines. The potential transformer reference currents $i_A$, $i_B$ and $i_C$ together with their resultant vector sum $i_o$ are shown by the solid lines in FIG. 3a. The resultant currents $I_o$ and $i_o$ are not to scale but have been exaggerated for the purpose of explanation. The bushing currents $I_A$, $I_B$ and $I_C$ lead the transformer currents by approximately 90°. Therefore, $I_o$ must be delayed by 90° to position $I'_o$ before differentially combining it with the vector sum transformer current $i_o$. The differential combination of $I'_o$ and $i_o$ yields a vector difference current $i_D$ as shown in FIG. 3b.

The vector sum bushing current $I_o$ results from the combination of unequal capacitances $C_1$ and unbalanced line-to-ground voltages. The vector sum transformer current $i_o$ also is the result of unbalanced system voltages.

Figure 3B:
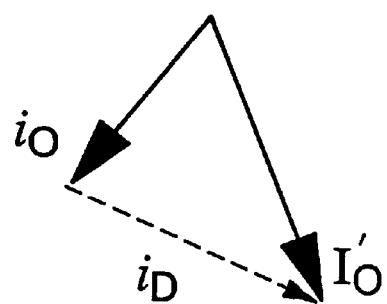

As seen in FIG. 3b, the difference current $i_D$ is obtained by differentially combining the vector sum potential transformer current $i_o$ with the vector sum bushing current $I'_o$. The detection system detects the currents $I_o$ and $i_o$ and the phase angle between them. It phase shifts the current $I_o$ by 90° to $I'_o$ and then computes the difference current $i_D$. The difference current $i_D$ is independent of the degree of system balance. If a change occurs in either the capacitance $C_1$ or the power factor or both of any of the three bushings, a change in the difference current $i_D$ will be detected and, if it exceeds a predetermined level, detector 30 furnishes an alarm to the user.

In reality, the bushings in a set are never identical, the system is never perfectly balanced, and the sum of the vectors is never zero. With this compensation procedure, when a change in system balance occurs at any given system voltage, such as an increase or decrease in one of the line-to-ground voltages, the initial difference current $i_{Do}$ will remain constant. This static initial difference current $i_{Do}$ may therefore be regarded as a systematic error in the measurement system, and its value may be determined during start-up of the monitoring system to establish a threshold. This initial value $i_{Do}$ of the difference current may then be subtracted from all subsequent evaluations of the difference current $i_D$ to provide an incremental difference current representative of bushing conditions.

Figure 4:
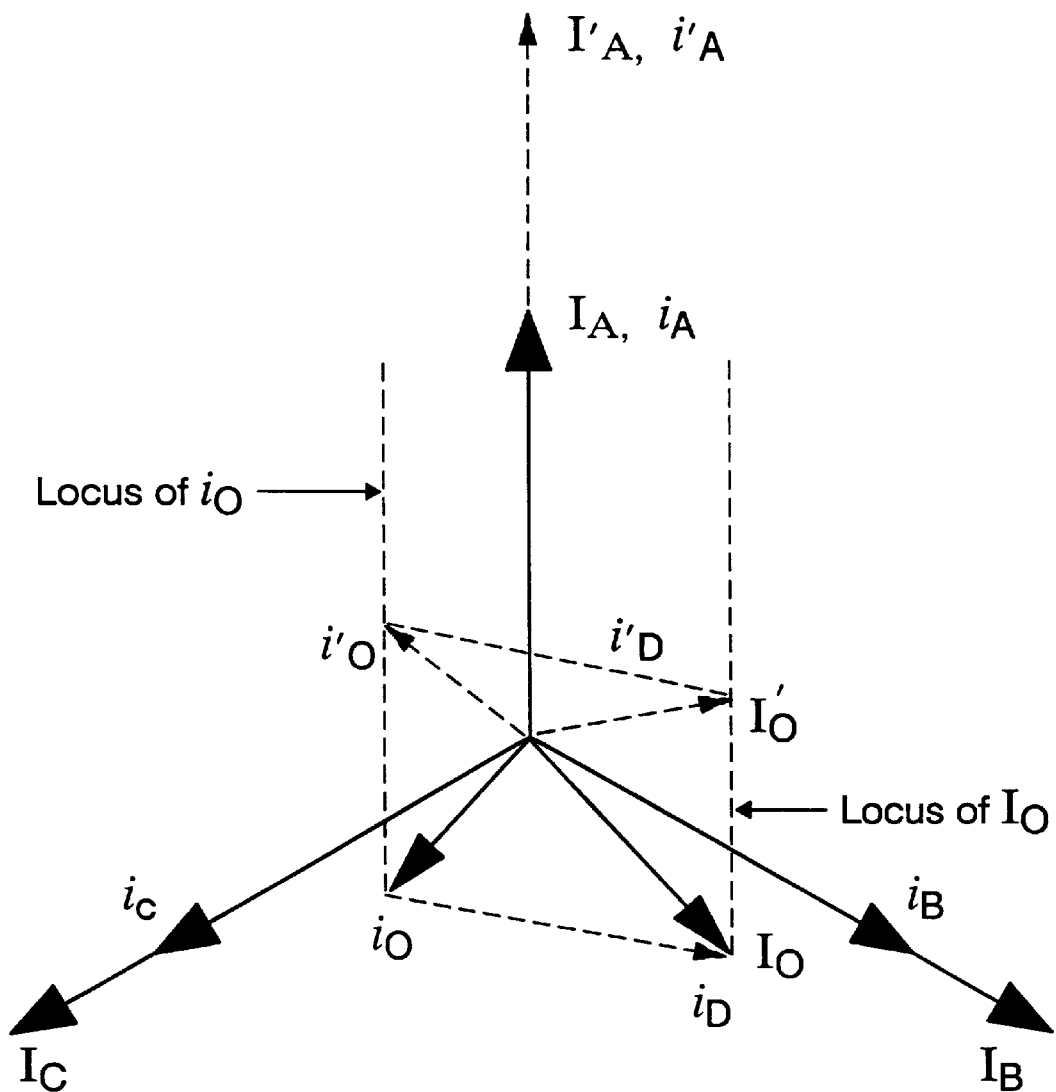
FIG. 4 is a vector diagram of the loci of residual currents when the amplitude of one of the phase voltages of the system varies.

FIG. 4 illustrates how a change in system balance affects the resultant currents from two sets of bushings. In this diagram, the initial currents from the bushings being monitored are $I_A$, $I_B$, and $I_C$ and their resultant current is $I_o$. The currents from the reference set of bushings are $i_A$, $i_B$ and $i_C$. The resultant current from the reference set of bushings is $i_A$. For purposes of explanation, it is assumed that $I_A$ equals $i_A$. Currents $i_B$ and $i_C$ are approximately equal to $I_B$ and $I_C$. If necessary, scaling may be performed in order to match as closely as possible the currents from the two sets of bushings. The vector difference between the two sets of resultant currents is $i_D$.

If now the voltage on phase A is increased, the currents $I_A$ and $i_A$ will increase to $I'_A$ and $i'_a$. The resultants will change to $I'_o$ and $i'_o$, respectively, and the locus of each resultant is shown on the diagram. It can be seen that the resultants vary in a non-uniform manner both with respect to magnitude and phase angle relative to one another. In addition, the vector difference $i_D$ changes to $i'_D$. However, the vector difference does not change in magnitude or phase angle relative to its original value. Therefore, the vector difference is insensitive to a variation in system balance as described. If, however, a change occurs in either the capacitance or the power factor of a bushing of either set, the resultant of only that set will change, thereby causing a change in the vector difference relative to its original value.

In practice, the currents from one set of bushings may not be exactly equal to those from the other set, even after scaling. Consequently, the vector differences $i_D$ and $i'_D$ may not be identical following a change in system balance. Nevertheless, the difference between the two difference vectors will be very small and is typically less than the minimum alarm threshold level, irrespective of the type of system imbalance.

Figure 5:
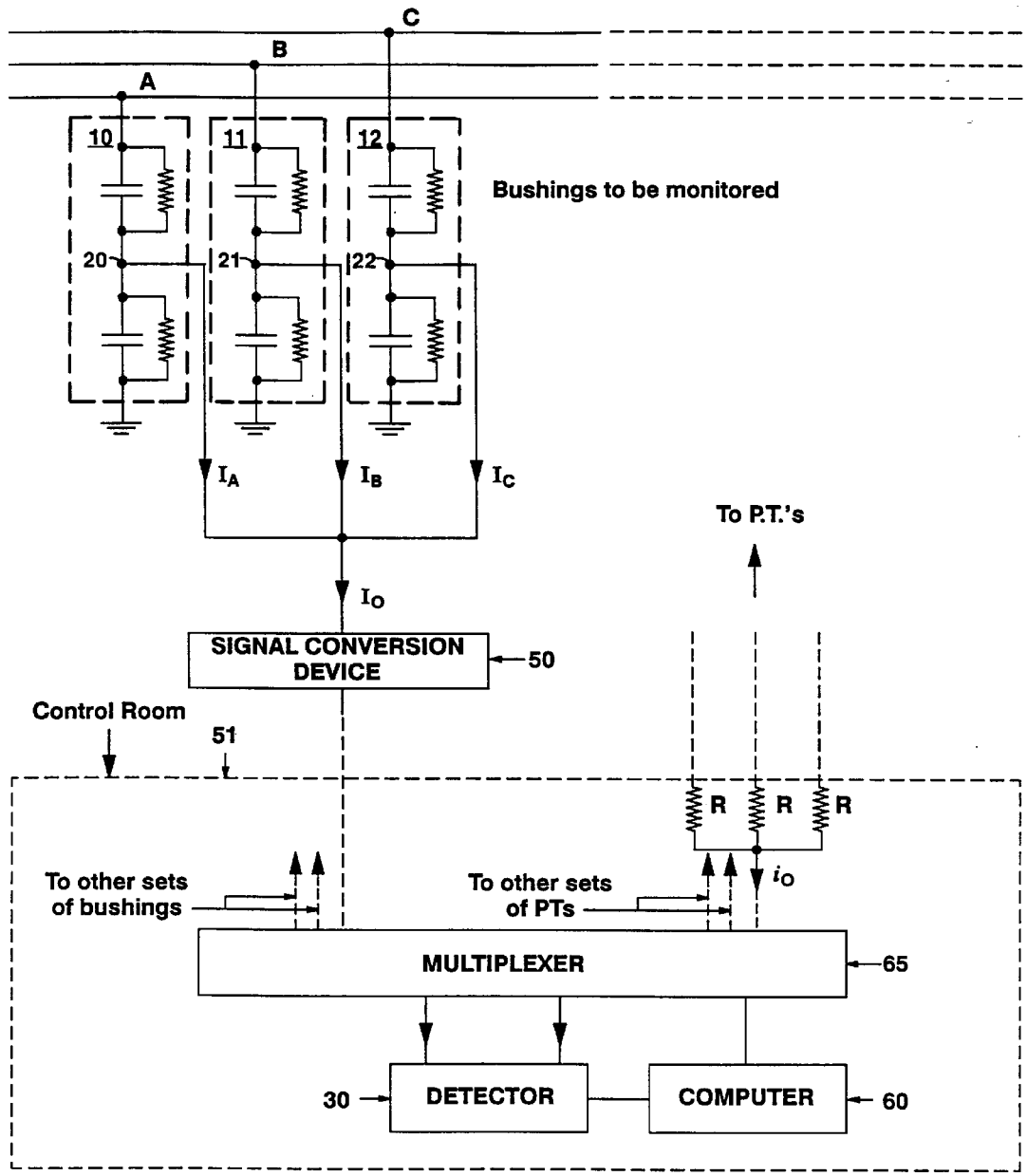
FIG. 5 is a schematic diagram of a system for monitoring a plurality of bushing sets on different voltage buses.

The schematic diagram of FIG. 5 shows another embodiment, a method of monitoring multiple groups of bushings on different voltage buses. A signal conversion device 50 located in the vicinity of each transformer converts the vector sum bushing current $I_o$ into a signal suitable for transmission, preferably in digital form, to the substation control room or computer 51 to be processed. Signals from all the substation potential transformers are available at substation control room 51 through respective resistors R. The current signals may be scanned before processing. Multiplexer 65 cyclically scans pairs of bushing group signals and their corresponding potential transformers on the same bus, so that all the bushings in a substation can be monitored by multiplexer 65. The scanning and detector circuitry may be controlled by computer 60, which also processes the detected data and provides an alarm signal when the difference signal exceeds the predetermined threshold level.

Due to the limited number of bits in the signal conversion device 50, measurement resolution may be impaired if the imbalance in the bushing currents due to capacitance differences is too high. This problem is resolved by providing means for independently regulating the gain associated with each input current, namely by electronic gain or by summing the leakage currents through a current transformer or other conversion device with a three-winding primary, (alternatively, one primary winding with multiple taps may be used.) Each winding is equipped with taps to permit regulation of the turns ratio associated with the corresponding input current. Any initial imbalance current due to gross differences in the capacitances of the bushings will be significantly reduced without affecting the performance of the measuring system. This also reduces the effects of system imbalance on measurements. Gross imbalance in the bushing currents may also be compensated by adjusting the resistors on the outputs of the potential transformers (PTs) (or other voltage devices) so that the output currents from the PTs match the bushing currents.

The monitoring system described above can also be modified depending on the user's requirements and the available equipment. For example, coupling capacitor voltage transformers (CCVTs) may be used instead of potential transformers for the measurement of transmission voltages, particularly at higher voltage levels. In that case, CCVTs would replace the potential transformers in FIG. 2. Since the ratios of CCVTs can change slowly with time due to the aging of their capacitors, the system will also detect a change in balance caused by a CCVT ratio change.

Further, if two or more power transformers are connected in parallel, the potential transformers in FIG. 2 may be replaced by a second group of three bushings connected in parallel to the same bus as the three bushings to be monitored. In this case the 90° rotation of the residual current vector is not required. As in the case of the CCVTs, if a change in the balance condition is detected, the problem bushing could be in either transformer, and further signal processing will enable the defective unit to be identified.

Figure 6:
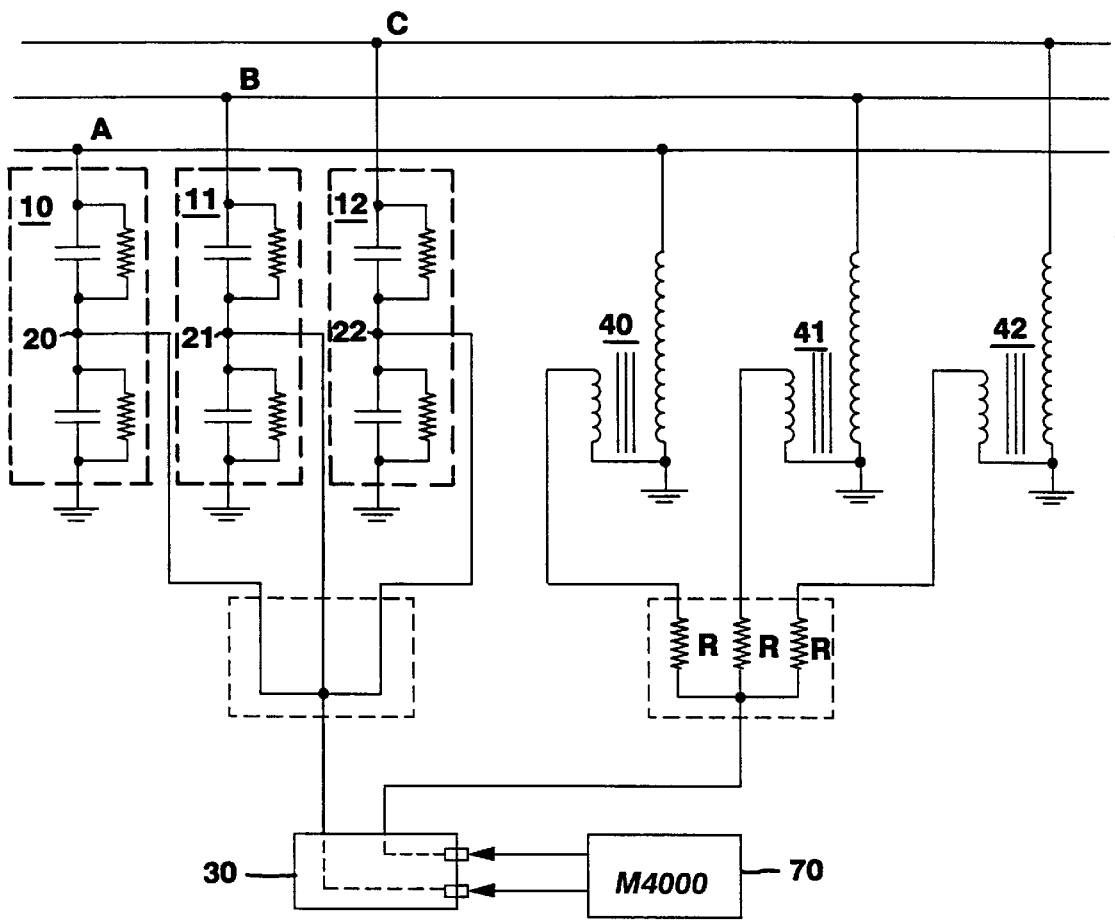
FIG. 6 is a schematic diagram of a portable system for monitoring a bushing set.

FIG. 6 shows a simplified method of performing occasional on-line checks on bushings at the location of the transformer. Measurements may be taken by the M4000 Insulation Analyzer 70 commercially available from Doble Engineering Company. The initial balance conditions are recorded and utilized as reference conditions during future checks. Using this arrangement, the M4000 Insulation Analyzer 70 is only connected to the local bushing monitor terminals when bushing conditions are checked.

Figure 10:
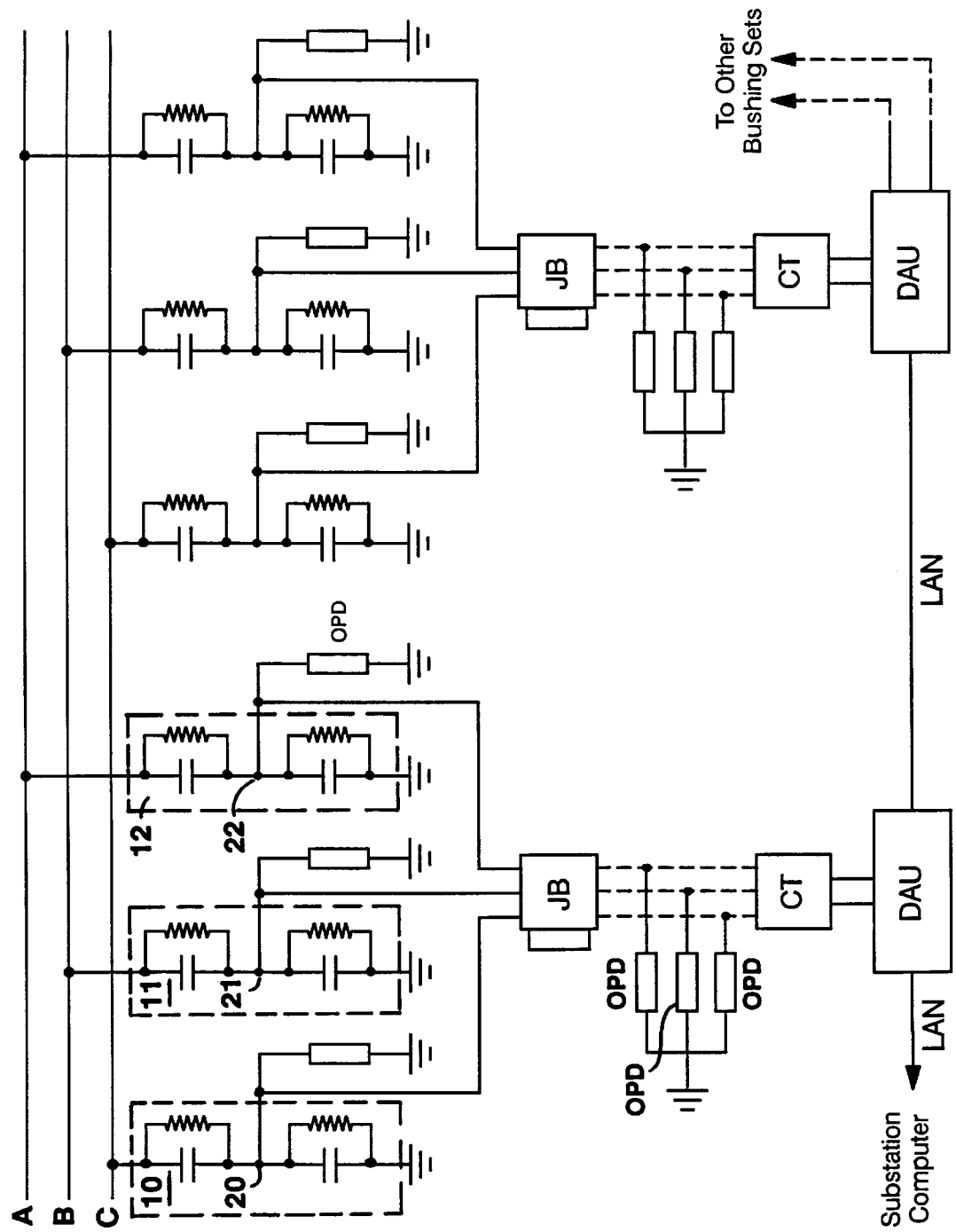
FIG. 10 shows an arrangement for monitoring two or more sets of bushings.

An arrangement for monitoring two or more sets of bushings is shown in FIG. 10. In this case the currents from each set of bushings is fed into a Junction Box, "JB", which is normally mounted on the side of each transformer. During normal operation the current signals are then fed from JB to the Current Transformer, "CT", for scaling and summing purposes. The output residual current from each CT is subsequently fed to a Data Acquisition Unit, "DAU", as shown. Overvoltage Protection Devices, "OPD" are also provided at the bushing taps and at the inputs to the CTs.

Communication is provided between the DAUs and also with the substation computer by means of a Local Area Network, "LAN".

In operation, the residual currents are digitized in the DAU and then transmitted to the substation computer for further processing. The processing involves the computation of residual vector differences between pairs of bushing sets. The vector differences are compared with initial values and, if a threshold level is exceeded, an alarm is provided for the user. Alarms of different levels of priority are provided depending on the magnitude of the change in the difference vector. Temperature corrections are also made and the suspect bushing is identified.

Figure 11:
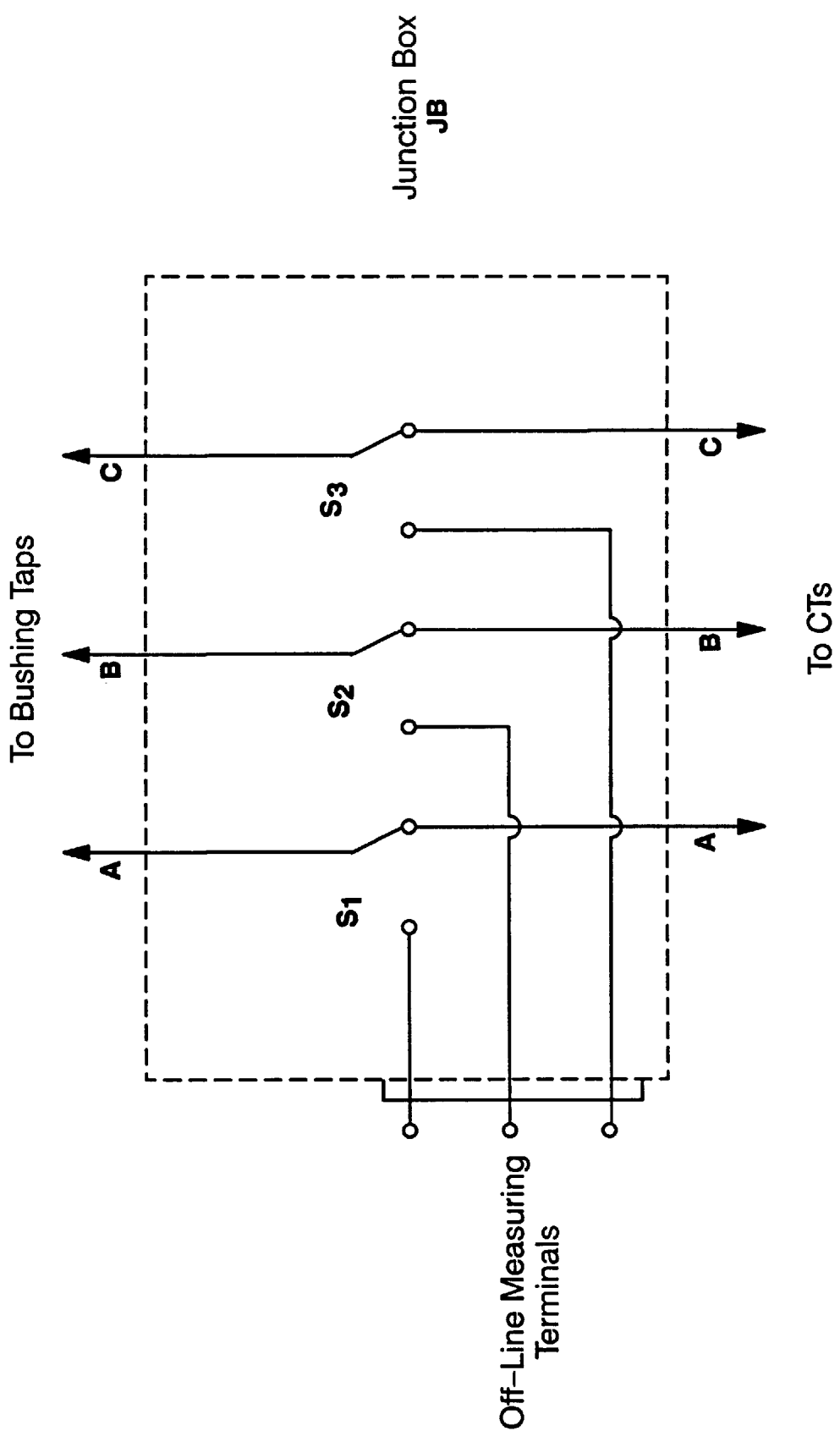
FIG. 11 shows switching circuitry for selectively directing bushing currents to a selected set of terminals.

The Junction Box JB contains switches $S_1$, $S_2$, $S_3$ which enable the bushing currents to be directed to another set of off-line measuring terminals as shown in FIG. 11. These terminals may be used for on-line or off-line measurements on the bushings one phase at a time. Also included in the Junction Box but not shown in the diagram is a set of auxiliary contacts which provide a signal to the DAU indicating the position of the switch within the Junction Box.

Figure 12B:
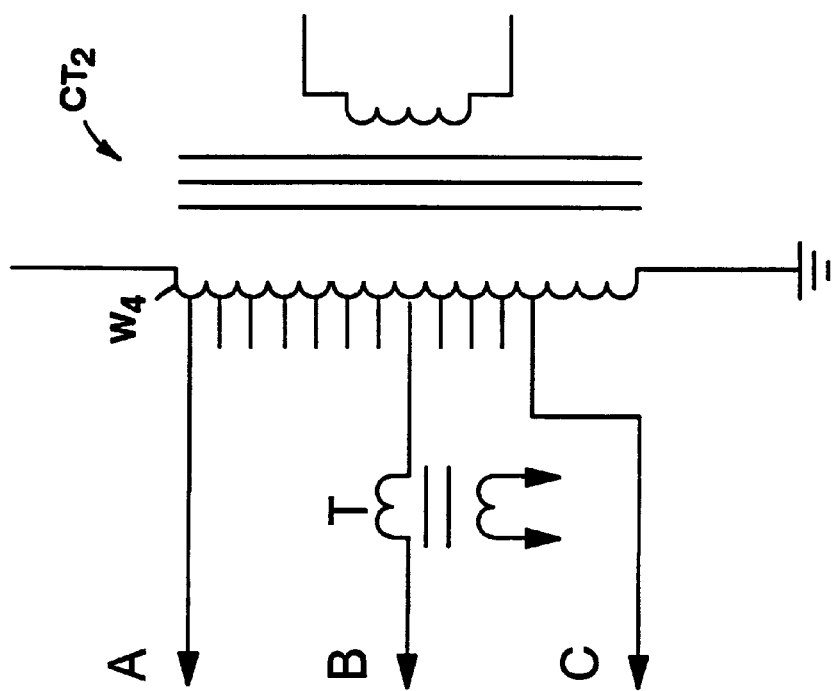
FIG. 12(a) and 12(b) show exemplary arrangements for the scaling current transformer.
Figure 12A:
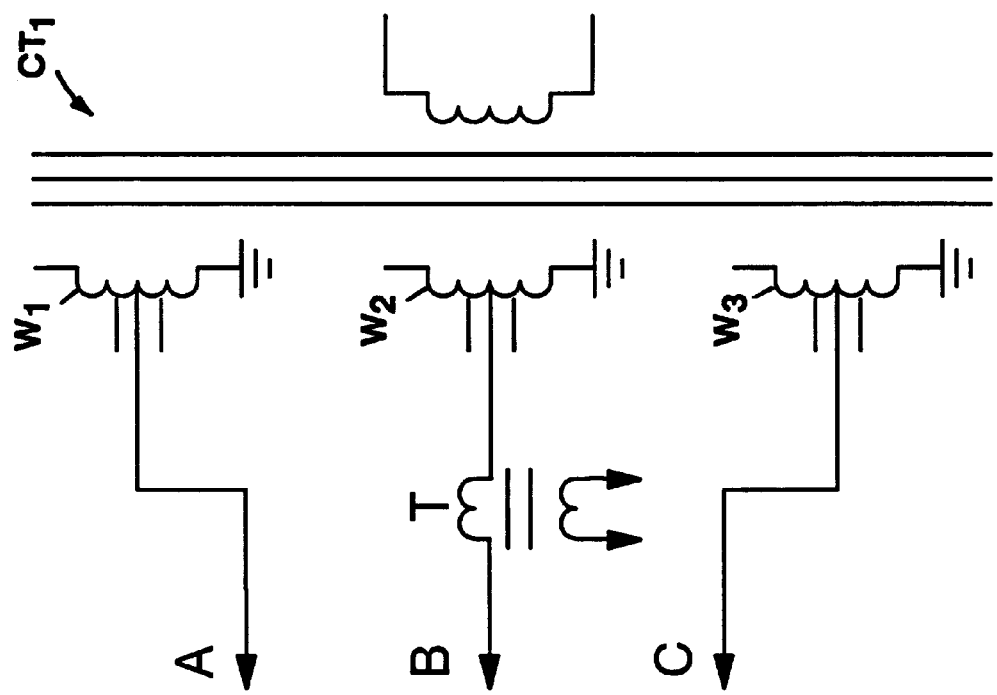

Two different arrangements $CT_1$, $CT_2$ may be used for the scaling CT. These are shown in FIG. 12. As shown in FIG. 12a, $CT_1$ has three separate primary windings $W_1$, $W_2$, $W_3$ as shown, and each primary has a number of taps. As shown in FIG. 12b, $CT_2$ has only one primary winding $W_4$ with taps. In each arrangement, there is an auxiliary current transformer "T" in series with the lead coming from the phase B bushing. The output from this auxiliary current transformer provides the reference signal which is used to identify the suspect bushing when the threshold level is exceeded.

Depending on the manufacturer and type of bushing, the power factor may increase or decrease with changes in temperature. Provided all three bushings are of the same type, the variation due to temperature will not cause a problem because temperature-related power factor changes will be identical on all three bushings. However, if the three bushings are not identical, it may be necessary to apply a correction to the vector sum bushing currents $I_o$ and $i_o$ before proceeding with the evaluation of the difference current $i_D$. Temperature correction factors may be applied automatically by a computer 60. If the measured difference current $i_D$ exceeds the level which could be due to temperature effects, the cause may be attributed to a defective bushing.

Figure 7:
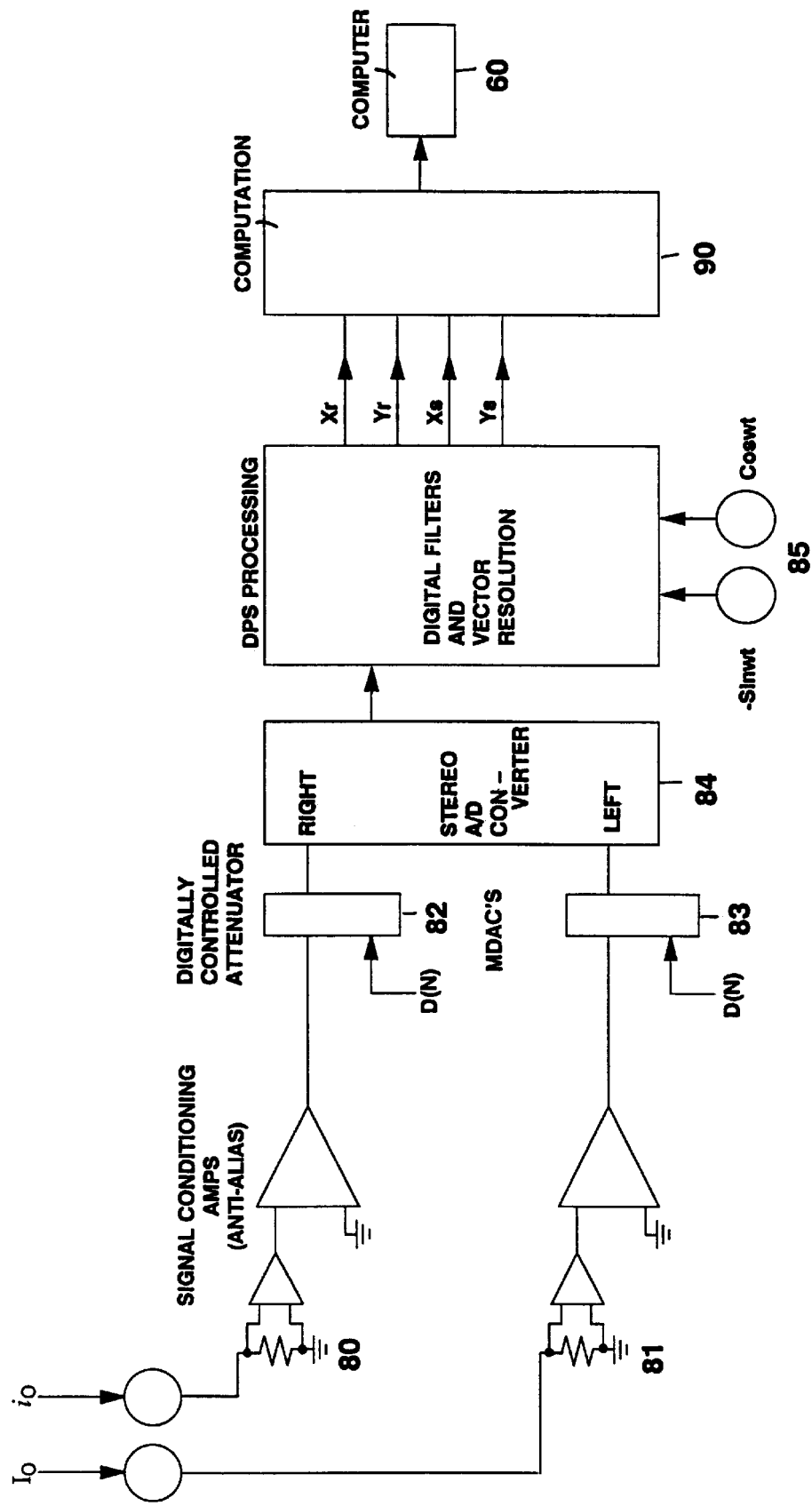
FIG. 7 is a schematic diagram of a system for simultaneous monitoring of two independent signals.

FIG. 7 shows part of a system used to monitor transformer bushings. The two vector sum current signals $I_o$ and $i_o$ are fed into two low impedance inputs 80 and 81 as shown. In this case it is assumed that the vector sum reference current $i_o$ is derived from a set of potential transformers. Processing of the current signals includes amplitude adjustment in attenuators 82 and 83, A/D conversion 84, and filtering and vector resolution 85. Computation circuitry 90 involves delaying the vector sum bushing current $I_o$ by 90° and differentially combining the signal corresponding to the vector sum potential transformer current $i_o$ with the signal corresponding to the vector sum bushing current $I_o$ delayed by 90°. The difference signal output $i_D$ may then be fed to computer 60.

Turning now to monitoring, computer software for the bushing monitoring system implements a decision-making algorithm for precise monitoring. The following exposition of the algorithm relates to monitoring multiple sets of bushings attached to the same three-phase voltage source. The inputs of the algorithm include the imbalance currents associated with the bushings to be monitored and external ambient and transformer top oil temperatures required to estimate the temperature of the insulation in the bushings. Each of the imbalance currents represents the vector sum of the insulation currents of the three bushings, one on each phase of the voltage apparatus.

The insulation current $I_{ik}$ is defined by $$I_{ik} = j\omega C_{ik}[1 - j \cos \theta_{ik}]V_k$$

where $C_{ik}$ is the capacitance and $\cos\theta_{ik}$ is the power factor. The outputs of the algorithm are the temperature-compensated values of the capacitance and power factor of each of the bushings. For M sets of three bushings (a, b and c), the imbalance currents $I_{io}$ being measured may be expressed as $$I_{io} = I_{ia} + I_{ib} + I_{ic} \quad (1)$$

for i=1, 2 . . . , M
where $I_{ia}$ is the insulation current measured at the tap of the phase a bushing in the ith set.

The algorithm is based on the following assumptions:
1. The number of sets is greater than or equal to two; i.e., $M \geq 2$.
2. All bushings are on the same voltage bus.
3. All imbalance-current waveforms have been acquired simultaneously.
4. The imbalance-current waveforms have been filtered to eliminate 60 Hz harmonic components.
5. The imbalance-current waveforms have been processed and are stored in vector form, either as the magnitude and phase or as the real and imaginary parts of a complex quantity.
6. The phase angles of the imbalance currents are measured with respect to the insulation current phasor associated with the b phase of the first set, $I_{1b}$. This is the preferred choice over the other two phases because of symmetrical capacitive coupling experienced by this bushing from the adjacent bushings.
7. The imbalance-current vectors have been processed through an averaging scheme aimed at reducing the fluctuating components of the imbalance currents which result from temperature differences caused by variations in the system load.
8. Only one of the three bushings in a set experiences a significant change in its electrical characteristics during the period of time between measurements.

The algorithm is executed every time a measurement of the bushing imbalance currents is made. The first step in the algorithm is to compute the residual of the imbalance currents for every set of bushings. The residual $R_i$ can be expressed as follows:

$$R_i = \frac{I_{io}(t) - I_{io}(0)}{C_{ia}(0) + C_{ib}(0) + C_{ic}(0)} \quad \text{for } i = 1, 2, \ldots, M \quad (2)$$

where $I_{io}(t)$ is the measured value of the imbalance current, $I_{io}(0)$ is the initial value of the imbalance current, and $C_{ia}(0)$, $C_{ib}(0)$ and $C_{ic}(0)$ are the initial values of the capacitances on the three phases of the ith bushing set.

The form of the residual $R_i$ is chosen to emphasize deviations from the initial imbalance current. This eliminates non-uniform variation in the magnitude of the residual that are associated with the initial imbalance current vector. The difference in the imbalance currents is normalized to the sum of the initial capacitances to reduce the effects of system imbalance when the capacitances of the bushings in the sets are significantly different.

The initial value of the imbalance current in the ith set is calculated from predetermined initial information according to the following expression:

$$I_{io}(0) = I_{ia}(0) + I_{ib}(0) + I_{ic}(0) \quad (3)$$

where the insulation currents are defined in terms of the capacitance and power factor of the bushings in the set as $$I_{ia}(0) = j\omega C_{ia}(0)[1-j\cos\theta_{ia}(0)]V_a$$

$$I_{ib}(0) = j\omega C_{ib}(0)[1-j\cos\theta_{ib}(0)]V_b$$

$$I_{ic}(0) = j\omega C_{ic}(0)[1-j\cos\theta_{ic}(0)]V_c \quad (4)$$

and where the line-to-ground voltages are defined in terms of the line-to-line rms voltage V and the power factor angle $\theta_{ib}$ by $$V_a = \frac{V}{\sqrt{3}} e^{-j(\theta_{1b} - \frac{2\pi}{3})}$$

$$V_b = \frac{V}{\sqrt{3}} e^{-j\theta_{1b}}$$

$$V_c = \frac{V}{\sqrt{3}} e^{-j(\theta_{1b} + \frac{2\pi}{3})} \quad (5)$$

The terms $e^{-j\theta_{1b}}$ account for the fact that the phases are measured with respect to the insulation current $I_{1b}$. Note that, for small power factor values, the phase angle $\theta_{1b}$ is approximately equal to $\pi/2$, so that $e^{-j\theta_{1b}} \approx -j$.

The next step in the algorithm involves the computation of the magnitude of the differences between residuals of every possible permutation of bushing sets taken two at a time. For the ith and jth sets, the differential $D_{ij}$ is defined as $$D_{ij} = |R_i - R_j| \quad (6)$$

where the residuals $R_i$ and $R_j$ are defined as above. For M sets, the total number of permutations P is $$P = \sum_{i=1}^{M-1} i = \frac{1}{2}M(M-1) \quad (7)$$

For example, for two sets of bushings, there is one such permutation.

For each differential $D_{ij}$, it is possible to determine which of the bushing sets has experienced a change. The following pseudo-code involves incrementing a bin count $\{B_i | B_1, B_2, \ldots, B_M\}$ for each of the M bushing sets:

```
for i = 1,M - 1
    for j = i + 1,M
        D_ij = |R_i - R_j|
        if D_ij > threshold
            then { determine which set has experienced the change
                   and increment the bin count for that set }
        end loop
    end loop
```

At the beginning of the procedure, there is an empty bin for every bushing set. Each time a change is detected in a bushing set, the count for that bin $B_i$ is increased by one. At the end of the procedure, each bin count represents the number of times that a change has been detected for that bushing set over the number of permutations P. The minimum bin count is zero, and the maximum is M−1. For example, if there are three sets of bushings (M=3), and only the first bushing set (i=1) significantly changes, $D_{12}$ and $D_{13}$ would exceed the threshold and the bin counts would be {2, 0, 0}. If the first two sets change, there is more than one possible count combination (e.g., {2, 1, 0}, {1, 2, 0} or {1, 1, 0}), depending on the actual magnitude of $D_{12}$, which is affected by the relative change in the signal from set 1 compared to that from set 2. A maximum of M−1 changes can be detected in any one measurement. As a further example, if all three bushing sets experience changes, one of the several possible counts for the three bins is {0, 0, 0}, which would lead to an incorrect conclusion that no change occurred in any of the bushings.

The algorithm involves the comparison of each differential to a threshold value. Since the threshold represents the precision of the measurement, it should be large enough that normal variations in the imbalance currents due to temperature fluctuations in the system are not interpreted as changes in the electrical characteristics of the bushings. To ensure this, the threshold is determined by a set of statistical processes applied to the first N values of each calculated differential. The number N should be large enough to yield a statistically significant sample size. When these values have been collected, the data is used to calculate a mean and standard deviation for each permutation of differentials. The threshold is set to three times the largest standard deviation.

The algorithm also monitors the bushings even during the initial period. This is accomplished by calculating the threshold from the user-supplied initial data and built-in values for variations in this data that reflect significant changes in the characteristics of the bushings. For example, variations of 10% in the capacitance and 1% in the power factor might be used to indicate a significant change. This initial threshold will be higher than that calculated statistically from the measured values of the imbalance currents.

If the differential $D_{ij}$ exceeds the threshold, the algorithm determines in which of the two sets the change has occurred by comparing the magnitudes of the two residuals. If the magnitude of $R_i$ is greater than the magnitude of $R_j$, the change will have occurred in the ith bushing set. Otherwise, the change will have occurred in the jth set. The change may have occurred in both bushing sets, in which case the algorithm selects the bushing set which experienced the larger change. Regardless of the outcome of the comparison, the algorithm accounts for such variations in the bin counts.

The remaining steps of the algorithm are illustrated by the following pseudo-code:

```
M_o = number of sets with zero bin counts
if M_o = 0
    then { the threshold is too low
           increase the threshold by 10%
```

-continued

```
        if threshold > maximum threshold
            then {issue a message alert}
        }
end algorithm
for i = 1,M
    if M_o ≦ { count of ith bin } ≦ M - 1
        then   { determine which bushing in the set has changed
               calculate the change in the value of the
               capacitance and power factor of the bushing }
        else { no change has occurred in the bushing set }
end loop
```

Having determined which bushing set has experienced a change, the algorithm first determines whether the value of the threshold used in the comparison was too low by counting the number of sets with zero bin counts ($M_0$). If none of the sets have zero bin counts, then the threshold was too low and the threshold is increased by 10%. The new value of the threshold is then compared to a maximum value, such as the one used during the learning period, and if it exceeds the maximum value, a message is issued to the user to warn that a runaway condition has been detected.

The algorithm passes through every bin and verifies that a change has occurred by ensuring that the bin count falls between the theoretical minimum ($M_0$) and maximum (M−1) values. If this condition is met, the procedure determines which of the bushings in the set experienced the change and calculates the approximate capacitance and power factor of the affected bushing. Although only the phase angle of the residual is used to determine which bushing experienced the change, both the magnitude and phase of the residual are used to calculate the new capacitance and power factor of the bushing.

Figure 8:
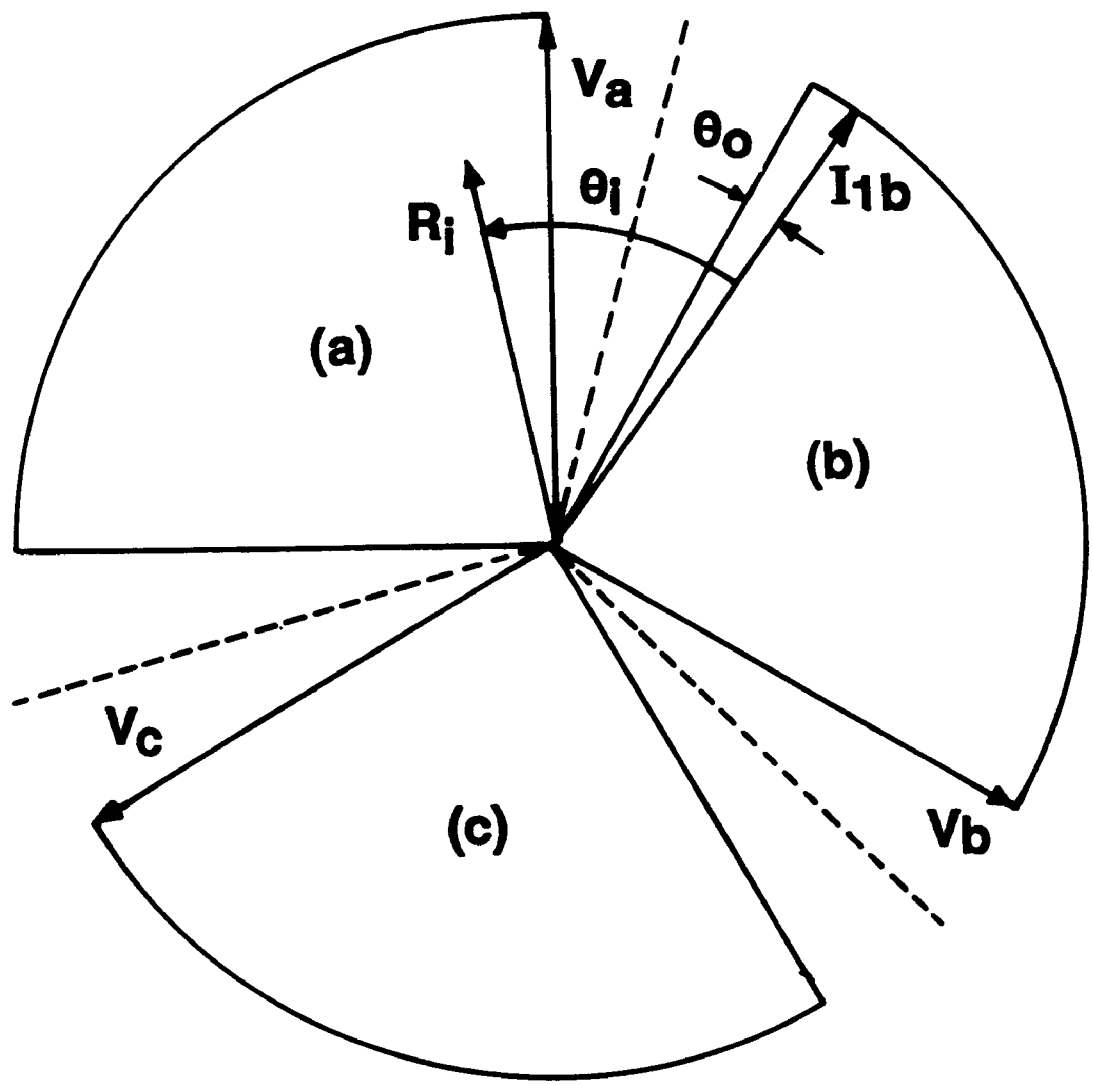
FIG. 8 is a diagram of the loci of residual points associated with positive changes in the capacitance and power factor of the bushings.

The affected bushing is selected by examining the sector of the phase plane in which the residual vector $R_i$ lies. If the change in the capacitance and power factor of the bushing is positive, the locus of points describing the residual vector is a 90° sector bounded by the line-to-ground voltage phasor and the capacitive component of the insulation current phasor, as shown in FIG. 8 by the three shaded regions. There are also three 30° sectors which are not associated with any of these changes. These sectors are used to pad the 90° sectors so that any error in the measurement of the phase angle will not affect the diagnosis of the affected bushing. Again, the phase angle is measured with respect to the phasor $I_{1b}$.

Once the affected bushing has been identified, the change in the capacitance and power factor values are determined from the magnitude and phase of the residual. The capacitance is determined from the component of the residual which projects on the axis normal to the voltage phasor. The power factor is determined from the component of the residual that projects on to the axis parallel to the voltage phasor. Expressing the residual associated with the ith set in terms of a magnitude and phase angle as $$R_i = |R_i| e^{j\theta_i} \tag{8}$$

a resistance and a capacitive component of the residual can be defined as $$R_{Ri} = -|R_i| \sin(\theta_i - \theta_0 - \theta_p)$$

$$R_{Ci} = |R_i| \cos(\theta_i - \theta_0 - \theta_p) \tag{9}$$

where the reference angle $\theta_0$ is defined as $$\theta_0 = \frac{\pi}{2} - \theta_{1b} \tag{10}$$

and $\theta_p$ is defined in the several cases below. These expressions require that the power factor angle $\theta_{1b}$ be known a priori. In practice, the previously calculated value of the power factor angle is used. Note that, for small power factor values, $\theta_{1b}$ is approximately equal to $\pi/2$ so that $\theta_o \approx 0$.

Several sets of conditional expressions provide means for calculating the capacitance and power factor of the bushings in the ith set. If the phase angle $\theta_p$ of the residual is such that.

$$\frac{1}{12}\pi < \theta_i - \theta_0 \le \frac{9}{12}\pi \tag{11}$$

Then the change is associated with the phase a bushing. In this case, the angle $\theta_p$ is equal to $2\pi/3$ and the values of the capacitance and power factor of the bushings are determined according to the following expressions:

$$C_{ia} = C_{ia}(0) + \left[\frac{C_{ia}(0) + C_{ib}(0) + C_{ic}(0)}{\omega V / \sqrt{3}}\right] R_{Ci} \tag{12}$$

$$C_{ib} = C_{ib}(0)$$

$$C_{ic} = C_{ic}(0)$$

$$\cos\theta_{ia} = \cos\theta_{ia}(0) + $$

$$\alpha(T)\left[\frac{C_{ia}(0) + C_{ib}(0) + C_{ic}(0)}{\omega C_{ia} V / \sqrt{3}}\right][R_{Ri} - R_{Ci}\cos\theta_{ia}(0)]$$

$$\cos\theta_{ib} = \cos\theta_{ib}(0)$$

$$\cos\theta_{ic} = \cos\theta_{ic}(0)$$

where $\alpha(T)$ is the multiplier used to express the power factor to the value measured at 20° C. and V is the line-to-line rms voltage.

If the phase angle $\theta_p$ of the residual is such that $$\frac{17}{12}\pi < \theta_i - \theta_0 \le \frac{1}{12}\pi \tag{13}$$

then the change is associated with the phase b bushing. In this case, the angle $\theta_p$ is equal to zero and the values of the capacitance and the power factor of the bushings are determined according to the following expressions:

$$C_{ia} = C_{ia}(0) \tag{14}$$

$$C_{ib} = C_{ib}(0) + \left[\frac{C_{ia}(0) + C_{ib}(0) + C_{ic}(0)}{\omega C_{ib} V / \sqrt{3}}\right] R_{Ci}$$

$$C_{ic} = C_{ic}(0)$$

$$\cos\theta_{ia} = \cos\theta_{ia}(0)$$

$$\cos\theta_{ib} = \cos\theta_{ib}(0) + $$

$$\alpha(T)\left[\frac{C_{ia}(0) + C_{ib}(0) + C_{ic}(0)}{\omega C_{ib} V / \sqrt{3}}\right][R_{Ri} - R_{Ci}\cos\theta_{ib}(0)]$$

$$\cos\theta_{ic} = \cos\theta_{ic}(0)$$

If the phase angle $\theta_p$ of the residual is such that $$\frac{9}{12}\pi < \theta_i - \theta_0 \leq \frac{17}{12}\pi \quad (15)$$

then the change is associated with the phase c bushing. In this case, the angle $\theta_p$ is equal to $4\pi/3$ and the values of the capacitance and power factor of the bushings are determined according to the following expressions:

$$C_{ia} = C_{ia}(0) \quad (16)$$

$$C_{ib} = C_{ib}(0)$$

$$C_{ic} = C_{ic}(0) + \left[\frac{C_{ia}(0) + C_{ib}(0) + C_{ic}(0)}{\omega V/\sqrt{3}}\right] R_{Ci}$$

$$\cos\theta_{ia} = \cos\theta_{ia}(0)$$

$$\cos\theta_{ib} = \cos\theta_{ib}(0)$$

$$\cos\theta_{ic} = \cos\theta_{ic}(0) +$$

$$\alpha(T)\left[\frac{C_{ia}(0) + C_{ib}(0) + C_{ic}(0)}{\omega C_{ic} V/\sqrt{3}}\right][R_{Ri} - R_{Ci}\cos\theta_{ic}(0)]$$

Thus, the temperature-compensated values of the capacitance and power factor can be calculated for each bushing every time a recording is made.

Figure 9:
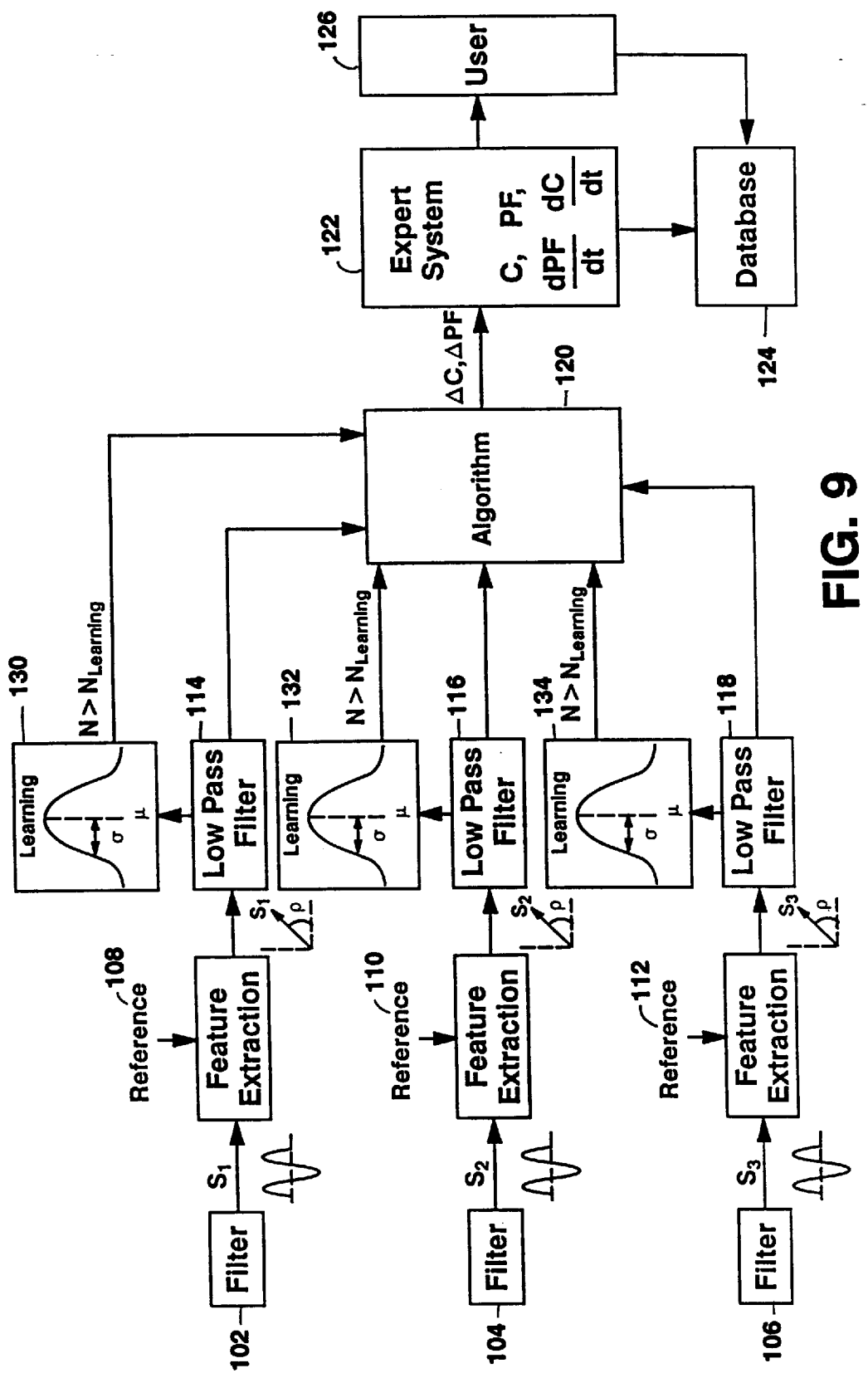
FIG. 9 is a block diagram of a system for determining the condition of three bushing sets on the same voltage bus.

The flow of information in one embodiment of the bushing monitoring system is shown in FIG. 9. Signals $S_1$, $S_2$ and $S_3$ are the imbalance current waveforms measured from three sets of three bushings. The imbalance current waveforms are filtered by filters 102, 104 and 106 and processed in the feature extractions 108, 110 and 112, which extract the imbalance current vectors (i.e. the magnitude and phase) from the waveforms.

The imbalance current vector information is passed through low pass filters 114, 116 and 118 before the algorithm 120 compares the imbalance currents with each other and the initial values to determine whether the threshold is exceeded. The threshold, which is unique for a given group of bushings, is determined using a learning process 130, 132 and 134. The learning process determines the threshold value by means of statistical processes applied to the magnitude of the imbalance current.

The threshold is determined during an initial period when the magnitude of the imbalance current is sampled for a period of time sufficiently long to provide a large population sample. The initial threshold is based on the nameplate data and specifications based on off-line testing experience.

If the threshold is not exceeded, nothing happens. If the threshold is exceeded, then the algorithm determines which of the bushings in the sets have changed, calculates the change in the capacitance and power factor for those bushings, temperature-compensates the calculated changes on the basis of the top-oil and ambient temperatures, and passes this information to the expert system 122.

The expert system 122 updates the previous power factor and capacitance values, calculates the rate of change of the power factor and capacitance, and sends this information to the database 124. From the database 124, the information is available to the user 126. The expert system evaluates the results, determines whether a message should be sent to the user, and if so, what type of message.

For example, if there is no change in the bushing conditions, the threshold is not triggered. The algorithm indicates to the expert system that there is no change in power factor or capacitance, and there is no message to the user.

If, however, a low energy partial discharge has developed in a wrinkled area of paper in the core of one bushing in a group, there is an increase in the current through the bushing core and consequently a change in the power factor and capacitance of the bushing. In this case, the algorithm determines that the threshold is exceeded, calculates the change in capacitance and power factor, and passes this information to the expert system. The expert system updates the previous power factor and capacitance values stored in the database, and evaluates the result. If the degree of change is small (e.g., the power factor increases from 0.5% to 0.75% and there is no change in capacitance), the expert system will determine that the degree of concern is low and that there is no need to notify the user. If the change is greater (e.g., the power factor increases from 0.75% to 1.00% and there is a change in capacitance of 1%), but not enough to require immediate attention, the user will be given a low-priority alarm message. Finally, if the change continues to increase (e.g., the power factor increases to 1.10%), the expert system issues a high-priority alarm to the user which requires immediate attention.

The statistical process in the algorithm for the bushing monitor provides for bushings having different temperature coefficients. The temperature of the insulation affects the power factor of the bushings. The temperature of the bushing insulation is approximated by the average between the top-oil temperature in the transformer and the ambient external temperature. Temperature fluctuations in the apparatus or in the environment can lead to fluctuation in the imbalance current. These fluctuations will be larger for those bushing sets in which the bushings have different temperature coefficients. Part of the fluctuation will be removed by the low-pass filter. The remainder of the fluctuation will affect the sensitivity of the monitoring system. In particular, increased fluctuations in the imbalance current of a set of bushings will result in a larger standard deviation for the distributions of differentials associated with that set, in turn resulting in a larger threshold.

In the bushing monitoring approach using multiple sets of bushings, a single set of bushings with different temperature coefficients affects the ability to resolve small changes in the characteristics of other sets of bushings. One way to avoid this problem is to apply a different threshold for each differential (for each pair of imbalance currents). Each threshold would be proportional to the standard deviation associated with the distribution of differentials. In this way, only those sets of bushings with different temperature coefficients would be affected by the larger threshold.

Correction for temperature variations is performed when the threshold is exceeded. The imbalance current changes with temperature, but this change has a frequency (12–24 hours) which is greater than the frequency of the change created by a problem in the bushings (weeks or months). The higher frequency component related to daily temperature variations can be filtered out. When the threshold is exceeded, the power factor change is corrected for temperature by using top oil and ambient temperature sensors, before it is added to the previous or initial value. Different bushings have different temperature correction factors.

Rain, snow and humidity in general affect surface conditions on the bushings. The humidity affects the current available at the tap through the electrostatic coupling between the core surface and the porcelain surface of the bushing. If all bushings are influenced by the surface conditions to the same degree, then the imbalance current will remain unchanged. However, if the bushings are influenced to a different degree, the imbalance current will change, but will return to normal after the surface conditions return to normal.

If there are multiple sets of bushings, some of which are on a circuit breaker, the set on one side of the circuit breaker will not be subjected to the same voltage changes as the other side if the circuit breaker is open. The sets on the circuit breaker can still be monitored. In fact, the algorithm recognizes that the changes are due to an inability to account for voltage fluctuations while the circuit breaker is open. All actions with respect to bushing conditions are deferred until the measurement with the circuit breaker closed is performed.

In the algorithm described, only changes in one bushing of a set may be monitored. However, a second bushing may be monitored when the first bushing stops changing by resetting the initial values of the capacitance, power factor, and imbalance current.

Other embodiments are within the scope of the claims.

What is claimed is:

1. A method of monitoring M groups of N elements in an N-phase alternating current network where M is a positive integer and N is an integer greater than one comprising:
   applying an N-phase voltage to the elements in parallel to produce a signal output from each element;
   cumulatively combining the signal outputs from the elements vectorially to obtain a vector sum element signal;
   applying said N-phase voltage to N reference devices in parallel to produce a reference signal output from each device;
   cumulatively combining the reference signal outputs from the reference devices vectorially to obtain a vector sum reference signal; and
   differentially vectorially combining the vector sum reference signal with the vector sum element signal delayed by a predetermined phase angle to provide a difference signal.

2. The method in accordance with claim 1 wherein the elements are bushings.

3. The method in accordance with claim 1 further comprising processing said signals to provide a sequence of difference signals each derived by differentially vectorially combining a vector sum reference signal with a vector sum element signal delayed by a predetermined phase angle and differentially combining said sequence of difference signals.

4. The method in accordance with claim 1 further comprising converting the vector sum element signal into a signal suitable for transmission for further processing.

5. The method in accordance with claim 1 wherein the signal outputs from the elements are corrected for temperature effects.

6. The method in accordance with claim 1 wherein the elements are high voltage current transformers.

7. The method in accordance with claim 1 wherein the reference signals are derived from the other elements.

8. The method in accordance with claim 7 wherein the elements are bushings.

9. The method in accordance with claim 7 wherein the elements are high voltage current transformers.

10. The method in accordance with claim 1 wherein the signal output of each element is scaled.

11. The method in accordance with claim 10 wherein the scaling is achieved by electronic gain.

12. The method in accordance with claim 10 wherein the scaling is obtained with taps in the primary winding(s) of a current transformer.

13. The method in accordance with claim 1 wherein the reference devices are from the group consisting of coupling capacitor voltage transformers, bushing potential devices and optical voltage transducers.

14. The method in accordance with claim 13 wherein the elements are bushings.

15. The method in accordance with claim 13 wherein the elements are high voltage current transformers.

16. The method in accordance with claim 13 further comprising loading the reference devices with resistors of value so that currents through the resistors are substantially equal to the signals derived from the elements.

17. The method in accordance with claim 16 wherein the elements are bushings.

18. The method in accordance with claim 16 wherein the elements are high voltage current transformers.

19. The method in accordance with claim 16 further comprising delaying the vector sum element signal by ninety degrees before differentially combining with the vector sum reference signal.

20. The method in accordance with claim 19 wherein the elements are bushings.

21. The method in accordance with claim 19 wherein the elements are high voltage current transformers.

22. The method in accordance with claim 19 further comprising processing said signals to provide a sequence of difference signals each derived by differentially vectorially combining a vector sum reference signal with a vector sum element signal delayed by a predetermined phase angle and differentially combining said sequence of difference signals.

23. The method in accordance with claim 22 wherein the elements are bushings.

24. The method in accordance with claim 22 wherein the elements are high voltage current transformers.

25. The method in accordance with claim 1 and further comprising furnishing at least two vector sum element signals.

26. The method in accordance with claim 25 and further comprising furnishing at least one difference signal by differentially vectorially combining each of the vector sum element signals with every other vector sum element signal.

27. The method in accordance with claim 26 further comprising furnishing a threshold value signal and comparing each difference signal with said threshold value.

28. The method in accordance with claim 27 wherein said threshold value signal is representative of at least one previously furnished difference signal.

29. The method in accordance with claim 27 further comprising comparing the magnitudes of the two vector sum element signals of a pair of vector sum element signals when the difference signal for the pair of vector sum element signals exceeds the threshold value signal,
   a larger magnitude being indicative of a change in the group of N elements from which the vector sum element signal having the larger magnitude is derived.

30. The method in accordance with claim 29 further comprising counting the number of changes associated with each group of N elements, in relation to the total number of difference signals for combinations of each of the vector sum element signals with every other vector sum element signal, to determine whether the group of N elements is affected.

31. The method in accordance with claim 30, further comprising providing an indication of which element in a group of N elements which is determined to be affected has changed by sensing the phase angle of the vector sum element signal derived from the group of N elements which is determined to be affected.

32. The method in accordance with claim 31 wherein the changed element is characterized by capacitance and power factor represented by the magnitude and phase of the vector sum reference signal for the group of N elements of which the element is a member.

33. The method in accordance with claim 32 further comprising providing an alarm signal indicating that the capacitance and power factor of the changed element has changed.

34. The method in accordance with claim 33 wherein the alarm signal is representative of the extent to which the capacitance and power factor of the changed element have changed.

35. The method in accordance with claim 31 further comprising providing an indication that the group of N elements which is affected is affected.

36. The method in accordance with claim 35 and further comprising providing an indication of whether the extent to which the group of N elements is affected is significant.

37. An apparatus for monitoring a plurality of groups of three bushings, each bushing characterized by a bushing current with each group associated with a group of three sources, each source characterized by a reference current in a three-phase alternating current network comprising:
   means for combining the bushing currents into a vector sum bushing current for each group,
   means for combining the reference currents into a vector sum reference current for each group,
   a detector, and
   a multiplexer for selectively providing both the vector sum bushing current and the vector sum reference current from each of said groups during mutually exclusive time intervals to said detector for comparing the vector sum bushing current of a selected group with the reference sum current of that selected group.

38. The apparatus in accordance with claim 37 wherein the multiplexer and the detector are located at a remote station.

39. The apparatus in accordance with claim 38 wherein the current outputs and the reference current are transmitted to the remote station in digital form.

40. Apparatus for monitoring M groups of N bushings in an N-phase alternating current network where M is a positive integer and N is an integer greater than one, each bushing providing a current output, the bushing output currents being cumulatively combined vectorially to obtain a vector sum bushing current, comprising:
   a group of N reference voltage devices connected in parallel to each group of bushings on the N-phase alternating current network;
   a vector adder for vectorially adding the current outputs from the reference voltage devices to obtain a vector sum reference current; and
   a comparator for differentially combining the vector sum reference current with the vector sum bushing current delayed by 90° to provide difference currents representative of a bushing condition.

41. A method of monitoring a pair of three high voltage current transformers groups in a three-phase alternating current network comprising:
   applying a three-phase voltage to a first group of three high voltage current transformers in parallel to produce a current output from each high voltage current transformer;
   cumulatively combining the current outputs from the first group of high voltage current transformers vectorially to obtain a first vector sum high voltage current transformer current;
   applying said three-phase voltage to a second group of three high voltage current transformers in parallel to produce a current output from each high voltage current transformer;
   cumulatively combining the current outputs from the second group of high voltage current transformers vectorially to obtain a second vector sum high voltage current transformer current; and
   differentially combining the second vector sum high voltage current transformer current with the first vector sum high voltage current transformer current vectorially.

42. An apparatus for monitoring a plurality of groups of three high voltage current transformers each transformer characterized by a bushing current with each group associated with a group of three sources each source characterized by a reference current in a three-phase alternating current network comprising:
   means for combining the bushing currents into a vector sum bushing current for each group,
   means for combining the reference currents into a vector sum reference current for each group,
   a detector, and
   a multiplexer for selectively providing both the vector sum bushing current and the vector sum reference current from each of said groups during mutually exclusive time intervals to said detector for comparing the vector sum bushing current of a selected group with the reference sum current of that selected group.

43. The apparatus in accordance with claim 42 wherein the multiplexer and the detector are located at a remote station.

44. The apparatus in accordance with claim 43 wherein the current outputs and the reference current are transmitted to the remote station in digital form.

45. Apparatus for monitoring M groups of N high voltage current transformers in an N-phase alternating current network, where M is a positive integer and N is an integer greater than one, each high voltage current transformer providing a current output, the high voltage current transformer output currents being cumulatively combined vectorially to obtain a vector sum high voltage current transformer current, comprising:
   a group of N reference voltage devices connected in parallel to each group of high voltage current transformers on the N-phase alternating current network;
   a vector adder for vectorially adding the current outputs from the reference voltage devices to obtain a vector sum reference current; and
   a comparator for differentially combining the vector sum reference current with the vector sum high voltage current transformer current delayed by 90° to provide difference currents representative of a high voltage current transformer condition.

46. A method of monitoring a pair of three bushing groups in a three-phase alternating current network comprising:
   applying a three-phase voltage to a first group of three bushings in parallel to produce a current output from each bushing;
   cumulatively combining the current outputs from the first group of bushings vectorially to obtain a first vector sum bushing current;
   applying said three-phase voltage to a second group of three bushings in parallel to produce a current output from each bushing;
   cumulatively combining the current outputs from the second group of bushings vectorially to obtain a second vector sum bushing current; and
   differentially combining the second vector sum bushing current from the first vector sum bushing current vectorially.

* * * * *